United States Patent [19]

Iwasa

[11] Patent Number: 5,572,464

[45] Date of Patent: Nov. 5, 1996

[54] SEMICONDUCTOR MEMORY DEVICE AND METHOD OF USING THE SAME

[75] Inventor: Shoichi Iwasa, Tokyo, Japan

[73] Assignee: Nippon Steel Corporation, Tokyo, Japan

[21] Appl. No.: 415,767

[22] Filed: Apr. 3, 1995

Related U.S. Application Data

[62] Division of Ser. No. 224,015, Apr. 6, 1994, abandoned.

[30] Foreign Application Priority Data

Apr. 6, 1993 [JP] Japan ................................ 5-103488

[51] Int. Cl.$^6$ ................................................. G11C 11/34
[52] U.S. Cl. ........................... 365/185.17; 365/185.18; 365/185.27
[58] Field of Search ........................... 365/185, 185.17, 365/185.18, 185.27

[56] References Cited

U.S. PATENT DOCUMENTS 4,959,812  9/1990  Momodomi et al. .................. 365/185

OTHER PUBLICATIONS

New Device Technologies For 5V–Only 4 Mb EEPROM With NAND Structure Cell, Momodomi et al., IEEE 1988, IEDM pp. 412–415.

A High–Density NAND EEPROM With Block–Page Programming For Microcomputer Applications, Iwata et al., IEEE, Journal of Solid–State Circuits, vol. 25, No. 2, Apr. 1990 pp. 417–424.

A 2.3 um$^2$ Memory Cell Structure for 16 Mb NAND EEPROMS, Shirota et al., IEEE 1990, IEDM pp. 103–106.

*Primary Examiner*—Joseph E. Clawson, Jr.
*Attorney, Agent, or Firm*—Pollock, Vande Sande & Priddy

[57] ABSTRACT

In a semiconductor memory device and a method for using the semiconductor memory device, the semiconductor memory device includes a plurality of memory cells series-connected to each other, and each formed by a P-channel transistor in which a control gate electrode is stacked via an insulating film on a floating gate electrode. One end of the plural memory cells series-connected to each other is connected to one of a source and a drain of a first selecting transistor. The other of the source and the drain of the first selecting transistor are connected to a bit line. The other end of the plural memory cells series-connected to each other is connected to one of a source and a drain of a second selecting transistor. The other of the source and the drain of the second selecting transistor is connected to a power source line.

4 Claims, 7 Drawing Sheets

5,572,464

SEMICONDUCTOR MEMORY DEVICE AND METHOD OF USING THE SAME

This application is a division of Ser. No. 08/224,015 filed on Apr. 6, 1994 now abandoned.

FIELD OF THE INVENTION

The present invention relates to a nonvolatile semiconductor memory device capable of electrically writing and erasing data, and more specifically, to a floating gate type EEPROM with a NAND structure.

BACKGROUND OF THE INVENTION

In an array of memory cells of a floating gate type EEPROM with a NAND structure, as represented by an equivalent circuit thereof in FIG. 1, each memory cell 11 is formed by a single N-channel transistor. Eight memory cells 11 corresponding to a 1 byte, or 8-bit memory cell, are series-connected to each other in such a manner that transistors for forming the mutually adjoining memory cells 11 commonly own the diffusion layer. One end of eight memory cells 11 series-connected to each other is connected to a source of a first selecting transistor 12, and a drain of the first selecting transistor 12 is connected to a bit line 13. The other end of eight memory cells 11 series-connected to each other is connected to a drain of a second selecting transistor 14, and a source of the second selecting transistor 14 is connected to a ground line 15. A control gate of the N-channel transistor for forming the memory cell 11 is connected to a word line 16, whereas control gates of N-channel transistors constituting the eight memory cells 11 series-connected to each other are connected to the different word lines 16, respectively. One ends of the word lines 16 are connected to an X-decoder 17. The other ends of the word lines 16 are connected to high voltage transistors 18. These high voltage transistors are connected to the corresponding word lines 16, respectively. One end of the bit line 13 is connected to a Y-decoder 21, and the other end of the bit line 13 is connected to a sense amplifier 22. In such a constructed EEPROM, the first selecting transistor 12 and the second selecting transistor 14 are also constructed of N-channel transistors.

The N-channel transistor for constituting the memory cell 11 is fabricated as follows. As illustrated in FIG. 2B, a P-type well 24 is formed within an N-type semiconductor substrate 23, and diffusion layers 25 functioning as the source and the drain are formed within the P-type well 24. A floating gate electrode 32 is formed via a gate insulating film 31 on a channel region 26 between two diffusion layers 25. The word line 16 functioning also as a control gate electrode is formed via a gate insulating film 33 on the floating gate electrode 32. An initial value of a threshold voltage of the N-channel transistor for constituting the memory cell 11, namely a threshold voltage under non-writing state is set to a negative value.

In the EEPROM with such a structure, to write data into, for instance, the memory cell 11 ( referred to as "selective memory cell Mi,j" hereinafter) shown in a central left portion of FIG. 2A, the potentials at the word line 16 (will be referred to as "selective word line Xi" hereinafter) connected to the selective memory cell Mi,j and the gate electrodes of the first selecting transistors 12 are set to 20 V (see FIG. 2A) under such a condition that the potentials at the semiconductor substrate 23 and the P-type well 24 are set to 0 V (see FIG. 2B). At this time, the potentials at the word lines 16 connected to the memory cells 11 (referred to as "non-selective memory cells" hereinafter) other than the selective memory cell Mi,j are set to 7 V, and the potentials at the gate electrodes of the second selecting transistors 14 are set to 0 V. The potential at the bit line 13 (referred to a "selective bit line Yi" hereinafter) related to the selective memory cell Mi,j is set to 0 V by way of the Y-decoder 21, and the potentials at other bit lines 13 (referred to as "non-selective bit lines" hereinafter) are set to 7 V by the Y-decoder 21. Under such a condition, since all of the N-channel transistors for forming the memory cells connected between the first selecting transistor 12 and the selective memory cell Mi,j are brought into the conductive conditions, the 0 V-potentinal at the selective bit line Yi is transferred to the drain of the N-channel transistor for forming the selective memory cell Mi,j. As a result, since the potential at the channel region 26 of the N-channel transistor for forming the selective memory cell Mi,j is also set to 0 V, a potential difference between this channel region 26 and the selective word line Xi becomes 20 V, the Fowler-Nordheim current flows through the gate insulating film 31, and electrons are injected into the floating gate 32 of the N-channel transistor for forming the selective memory cell Mi,j. As a consequence, the threshold voltage of the N-channel transistor for forming the selective memory cell Mi,j is changed from a negative value to a positive value (normally, 0 to 3.5 V).

It should be noted that the potential at the selective word line Xi becomes 20 V, to which the non-selective memory cell Mi,j+1 located at the right side of the selective memory cell Mi,j shown in FIG. 2A is connected. However, since the potential at the non-selective bit line Yj+1 related to the non-selective memory cell Mi,j+1 becomes 7 V, and also the potential at the channel region 26 of the N-channel transistor for forming the non-selective memory cell Mi,j+1 becomes 7 V similarly, a potential difference between this channel region 26 and the selective word line Xi is only 13 V. As a result, since no Fowler-Nordheim current flows through the gate insulting film 31 of the N-channel transistor for forming the non-selective memory cell Mi,j+1, no erroneous writing operation is carried out. A potential at a word line (referred to as "non-selective word line Xi+1" hereinafter), to which the non-selective memory cell Mi+1,j located at the lower side of the selective memory cell Mi,j shown in FIG. 2A is connected, becomes 7 V. However, also under this condition, a potential difference between the non-selective word line Xi+1 and the channel region 26 of the N-channel transistor for forming the non-selective memory cell Mi+1,j is only 7 V. As a consequence, no Fowler-Nordheim current flows through the gate insulating film 31 of this N-channel transistor, and thus no erroneous writing operation is performed.

In the reading operation of the data from the selective memory cell Mi,j, as illustrated in FIG. 3, the potentials at the gate electrodes of the first selecting transistors 12, the gate electrodes of the second selecting transistors 14, and the word lines other than the selective word line Xi are set to 5 V, so that the first selecting transistors 12, the second selecting transistors 14, and the non-selective memory cells are brought into the conductive conditions. Further, the potential at the selective word line Xi is set to 0 V and the potential at the selective bit line Yi is set to 5 V. The non-selective bit lines such as the non-selective bit line Yi+1 are brought into open conditions. At this time, if the data has been written into the selective memory cell Mi,j, and the threshold voltage of the N-channel transistor for forming the selective memory cell Mi,j is positive, then this N-channel transistor does not become conductive, but a voltage of 5 V is applied to the sense amplifier 22. As a result, data of "0" is outputted from the sense amplifier 22. On the other hand, if no data has been written into the selective memory cell Mi,j and the threshold voltage of the N-channel transistor for forming the selective memory cell Mi,j is negative, then this N-channel transistor becomes conductive, and the voltage of 0 V is applied to the sense amplifier 22. As a result, data of "1" is outputted from the sense amplifier 22.

In case that the data written into the selective memory cell Mi,j is erased, the potential at the P-type well 24 is set to 12 V, and also the potential at the selective word line Xi is set to 0 V. As a consequence, the electrons present in the floating gate electrode 32 of the N-channel transistor for forming the selective memory cell Mi,j is ejected as a Fowler-Nordheim current into the P-type well 24. It should be noted that in this case, since the electrons present in the floating gate electrode 32 are similarly ejected into the P-type well 24 in other memory cells (non-selective memory cell Mi,j+1 etc.) to which the selective word line Xi is connected, the data erasing operation is carried out in unit of the word line 16.

However, in the above-described prior art, during the data writing operation, the threshold voltages of the memory cells 11 under the non-writing state set to the negative values are brought into the positive values. On the other hand, during the data reading operation of this prior art, the potentials at the word lines to which the non-selective memory cells are connected are brought into 5 V, so that the non-selective memory cells are brought into the conductive conditions. As a result, if the threshold voltages of the memory cells 11 would not be selected to be lower than, or equal to 3.5 V even under the data writing state, then the resultant current during the conductive condition of the memory cells would become low, and the accessing speed to the selective memory cell Mi,j would be lowered. The value of the threshold voltage of the memory cell 11 under such a condition that the data has been written therein will depend on the amount of the injected electrons, and large fluctuation may occur in the amount of the injected electrons. If an excessive data writing operation is performed, an excessive amount of electrons is injected. This may cause the threshold voltage of the memory cell 11, to which the data has been written, to be higher than, or equal to 3.5 V. As a consequence, the accessing speed to the selective memory cell Mi,j is not always fast in the above-explained prior art.

SUMMARY OF THE INVENTION

An object of the present invention to provide a semiconductor memory device and a using method thereof capable of increasing a speed to access to a selective memory cell.

A semiconductor memory device, according to the present invention, comprises: a plurality of memory cells series-connected to each other, each formed by a P-channel transistor in which a control gate electrode is stacked via an insulating film on a floating Gate electrode; a first selecting transistor having a source and a drain, one of the source and the drain being connected to one end of the plural memory cells series-connected to each other; a bit line connected to the other of the source and the drain of the first selecting transistor; a second selecting transistor having a source and a drain, one of the source and the drain being connected to the other end of the plural memory cells series-connected to each other; and a power source line connected to the other of the source and the drain of the second selecting transistor.

In the semiconductor memory device of the present invention, since the memory cells are formed by the P-channel transistors, the threshold voltage under the non-writing state of data may be set to a positive value, and also the threshold voltage may be set to a negative value by writing data. When electrons are ejected from the floating gate electrode, the potential at the floating gate electrode is increased, and the electron ejection is ceased due to self convergence. As a consequence, since the positive threshold voltage under the non-writing condition does not depend upon an injected amount of electrons, but is determined based on only the manufacturing process factors such as impurity concentration in the surface of the semiconductor substrate, and the film thickness of the gate insulating film, fluctuation in the positive threshold voltages can be reduced. On the other hand, when data is read out, the P-channel transistors forming the non-selected memory cells are brought into the conductive conditions. However, even when excessive data writing operations are performed, in the present invention the injected amount of electrons does not become too excessive. Thus, the threshold voltage is set to the correct negative value by the data writing operation and no problem is produced in reading of the data. Also, since the memory cells are formed by the P-channel transistors, the P-type semiconductor substrate is employed in order to apply a bias voltage to an N-type well when the data is erased.

A method for writing to a semiconductor memory device, according to the present invention, uses a semiconductor memory device having a plurality of memory cells series-connected to each memory cell other, each formed by a P-channel transistor in which a control gate electrode is stacked via an insulating film on a floating gate electrode. A first selecting transistor having a source and a drain, is provided. One of the source and the drain of the first selecting transistor is connected to one end of the plural memory cells series-connected to each other a bit line is connected to the other of the source and the drain of the first selecting transistor a second selecting transistor having a source and a drain is also provided. One of the source and the drain of the second selecting transistor is connected to the other end of the plural memory cells series-connected to each other. A power source line is connected to the other of the source and the drain of said second selecting transistor. The method includes the steps of: setting, to a positive value, a potential at a control gate electrode of a P-channel transistor forming a memory cell selected from the plurality of memory cells to a positive value; producing an avalanche breakdown at a drain junction of the P-channel transistor for forming the selected memory cell; and writing data into the selected memory by injecting electrons generated by the avalanche breakdown into a floating gate electrode of the P-channel transistor forming the selected memory cell.

A method for reading a semiconductor memory device, according to the present invention, uses a semiconductor memory device having a plurality of memory cells series-connected to each memory cell other, each formed by a P-channel transistor in which a control gate electrode is stacked via an insulating film on a floating gate electrode. A first selecting transistor having a source and a drain is provided. One of the source and the drain of the first selecting transistor is connected to one end of the plural memory cells series-connected to each other. A bit line is connected to the other of the source and the drain of the first selecting transistor; a second selecting transistor having a source and a drain is also provided. One of the source and the drain of the second transistor is connected to the other end of the plural memory cells series-connected to each other. A power source line is connected to the other of the source and the drain of the second selecting transistor. The method includes the steps of: producing a voltage difference between one end of the plural memory cells and said other end of the plural memory cells; bringing all of the P-channel transistors forming memory cells not selected from the plural memory cells, the first selecting transistor, and said second selecting transistor into conductive conditions; selecting potentials at control gate electrodes of the P-channel transistors forming the memory cells not selected from the plural memory cells to be an intermediate voltage between a threshold voltage under a data writing condition and a threshold voltage under a data not writing condition; and reading data written into a memory cell selected from the plural memory cells by judging whether or not a current flows through the bit line.

DESCRIPTION OF THE PREFERRED EMBODIMENTS

Figure 1:
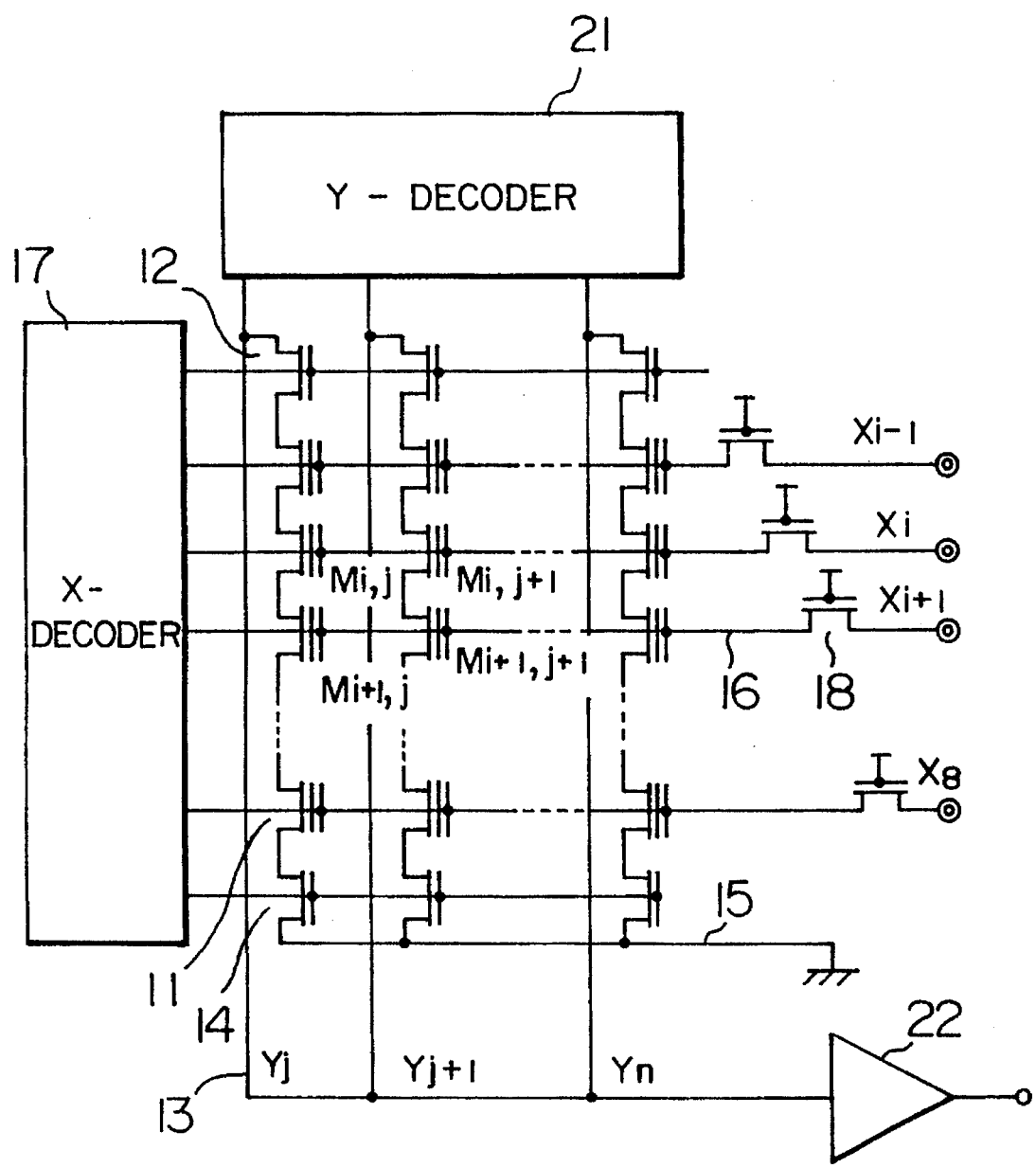
FIG. 1 is an equivalent circuit diagram for the array of the memory cells of the conventional floating gate type EEPROM with the NAND structure.
Figure 2A:
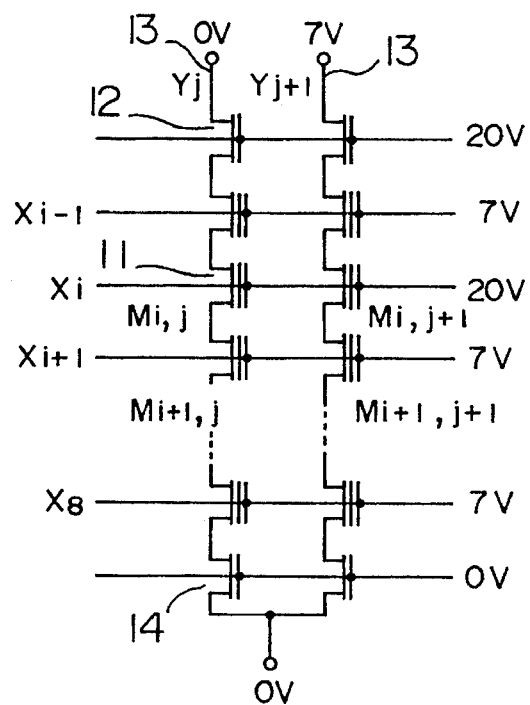
FIG. 2A is an equivalent circuit diagram for the array of the memory cells used to explain the data writing method with respect to the EEPROM shown in FIG. 1.
Figure 2B:
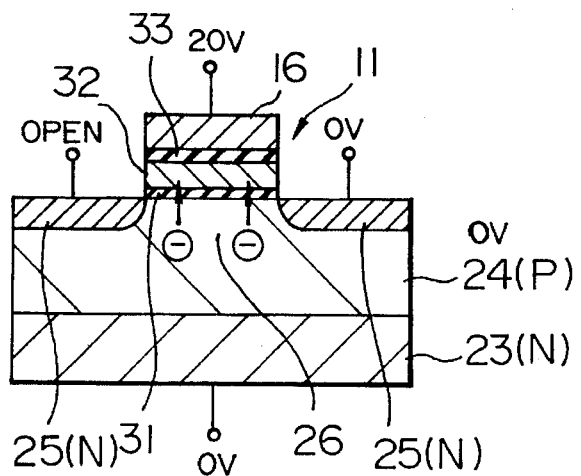
FIG. 2B is a sectional view of the memory cell for explaining the data writing method with respect to the EEPROM shown in FIG. 1.
Figure 4A:
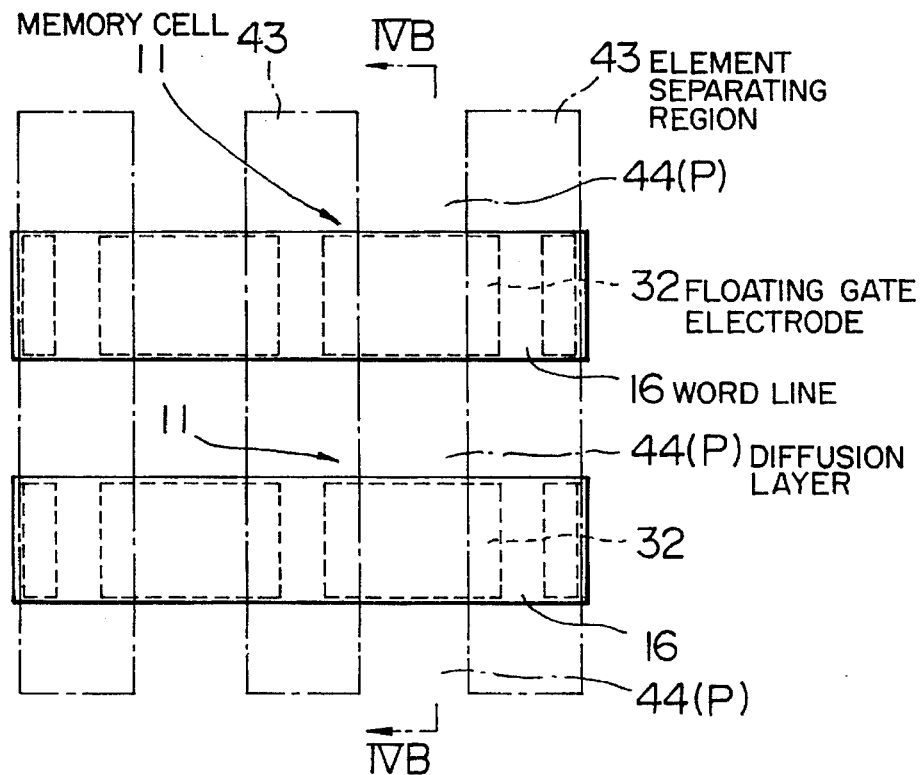
FIG. 4A is a plan view for representing a structure of a transistor for constituting a memory cell of an EEPROM according to an embodiment of a semiconductor memory device of the present invention.
Figure 4B:
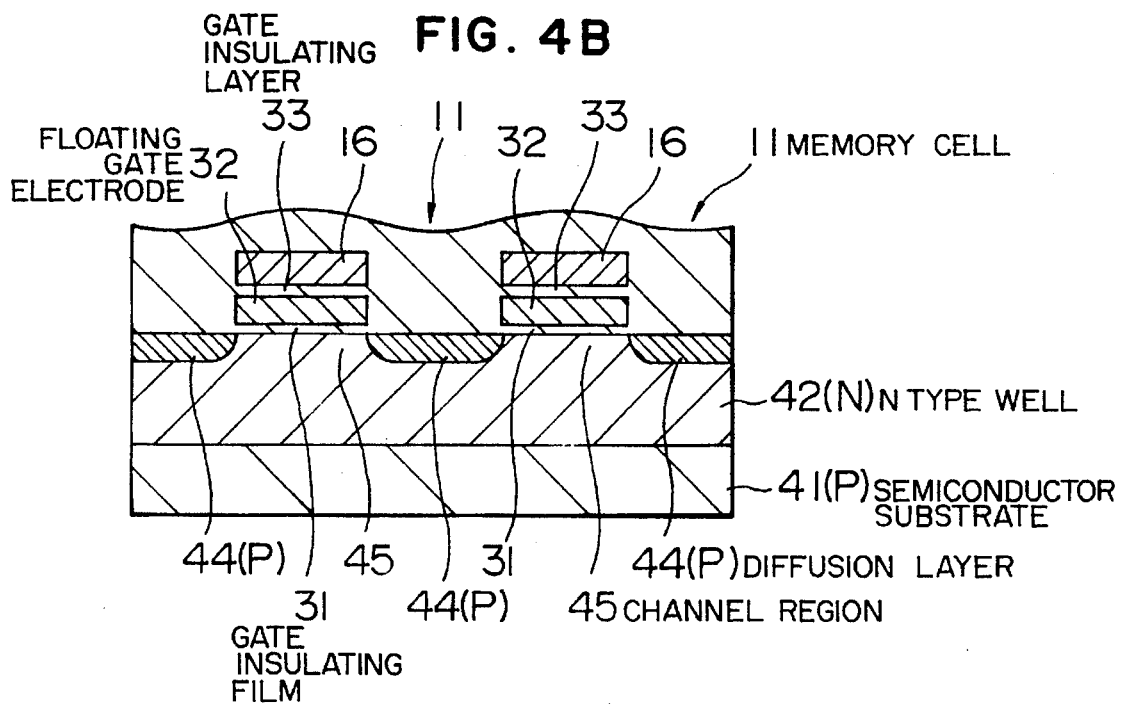
FIG. 4B is a sectional view taken along a line IVB—IVB of FIG. 4A.

A semiconductor memory device according to one embodiment of the present invention is a floating gate type EEPROM with a NAND type structure having a different structure from that of the conventional EEPROM shown in FIG. 1. In he present invention all of the transistors constituting the memory cells 11, the first selecting transistors 12, the second selecting transistors 14, and the high voltage transistors 18 are constructed of P-channel transistors. Accordingly, the P-channel transistor forming the memory cell 11 is structured as follows. As illustrated in FIG. 4B, an N-type well 42 is formed within a P-type semiconductor substrate 41. P-type diffusion layers 44 functioning as a source and a drain, are formed within an element forming region surrounded by an element separating region 43 (see FIG. 4A) formed in the N-type well 42. A floating gate electrode 32 is formed via an insulating film 31 on a channel region 45 between the two diffusion layers 44. A film thickness of the gate insulating film 31 is selected to be 100 to 120 angstroms in order that a Fowler-Nordheim current may flow under such an elective field of approximately 10 MV/cm. A word line 16 having another function as the control gate electrode is formed via a gate insulating film 33 on the floating gate electrode 32.

Figure 5A:
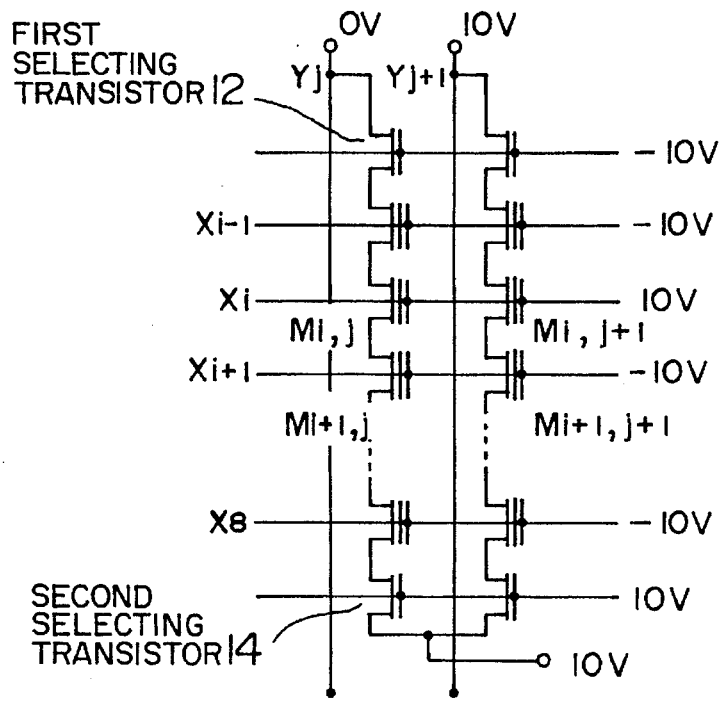
FIG. 5A is an equivalent circuit diagram of an array of memory cells for explaining a data writing method with regard to the EEPROM according to the embodiment of the semiconductor memory device of the present invention.
Figure 5B:
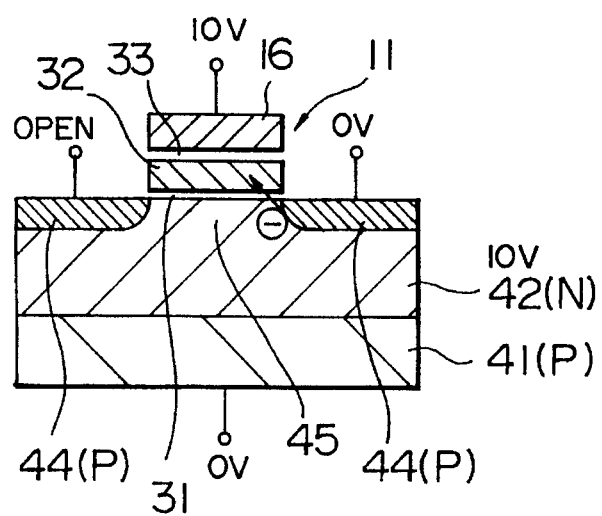
FIG. 5B is a sectional view of the memory cell for explaining a data writing method with respect to the EEPROM according to the embodiment of the semiconductor memory device of the present invention.

To write data into a selective memory cell $M_{i,j}$ within the EEPROM with the above-described structure, according to one embodiment of the semiconductor memory device of the present invention, potentials at a selective word line Xi and gate electrodes of the second selecting transistors 14 are set to 10 V, and potentials at the word lines 16 other than the selective word line Xi and gate electrodes of the first selecting transistors 12 are set to −10 V under such a condition that potentials at the semiconductor substrate 41 and the N-type well 42 are set to 0 V and 10 V, respectively (see FIG. 5B). A potential at a selective bit line Yj is set to 0 V, and potentials at bit lines (non-selective bit line Yj+1 etc.) except for the selective bit line Yj are set to 10 V. In other words, only the P-channel transistor for forming the selective memory cell $M_{i,j}$ among the P-channel transistors constituting the eight series-connected memory cells containing the selective memory cell $M_{i,j}$ is brought into the non-conductive condition, the first selecting transistors 12 are brought into the conductive conditions, and the second selecting transistors 14 are brought into the non-conductive conditions. Therefore, since 0 V corresponding to the potential at the selective bit line Yj is transferred to the drain of the P-channel transistor forming the selective memory cell $M_{i,j}$, and also the source of the P-channel transistor forming the selective memory cell $M_{i,j}$ is brought into the open condition, an avalanche breakdown occurs between the N-type well 42 and the drain of the P-channel transistor for forming the selective memory cell $M_{i,j}$. Only electrons among electron/hole pairs produced by this avalanche breakdown are drawn by the selective word line Xi whose potential is set to 10 V, and then are injected into the floating gate electrode 32 of the P-channel transistor for forming the selective memory cell $M_{i,j}$. As a result, the threshold voltage of the P-channel transistor for forming the selective memory cell $M_{i,j}$ becomes the negative value from the positive value.

Figure 3:
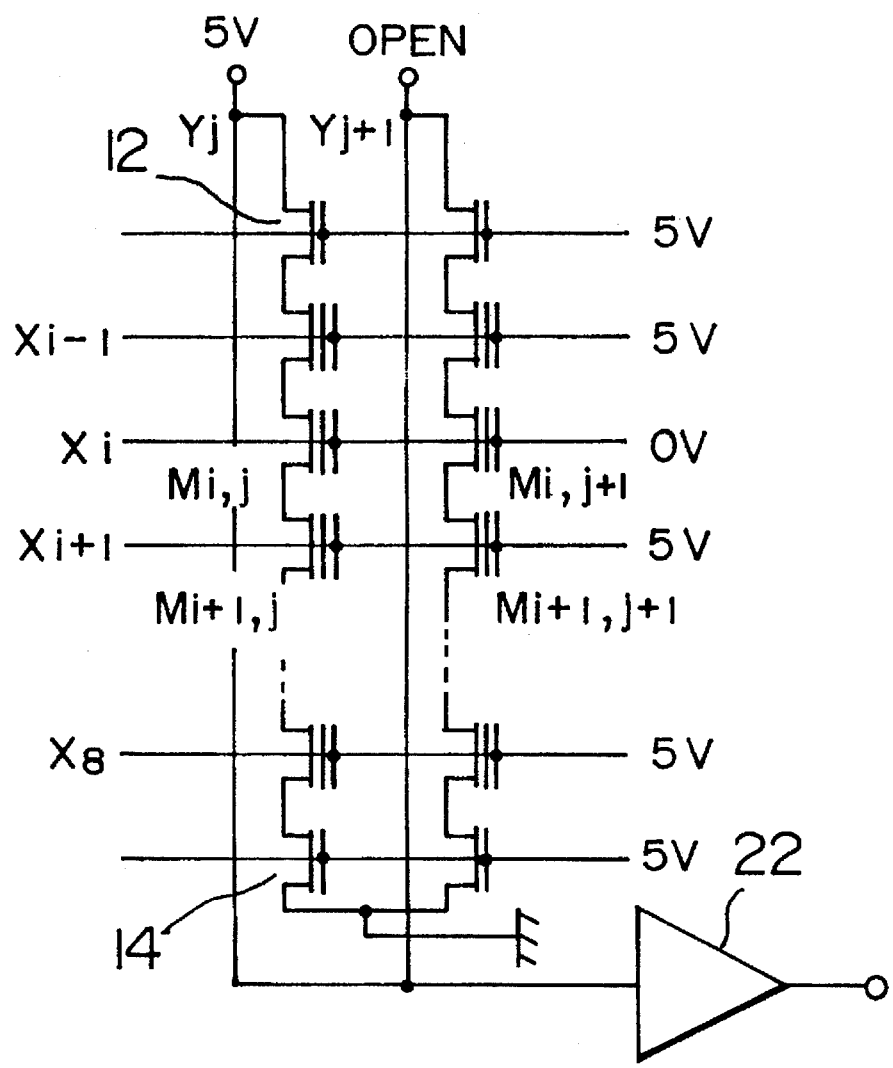
FIG. 3 is an equivalent circuit diagram of the array of the memory cells for explaining the data reading method with respect to the EEPROM represented in FIG. 1.
Figure 6:
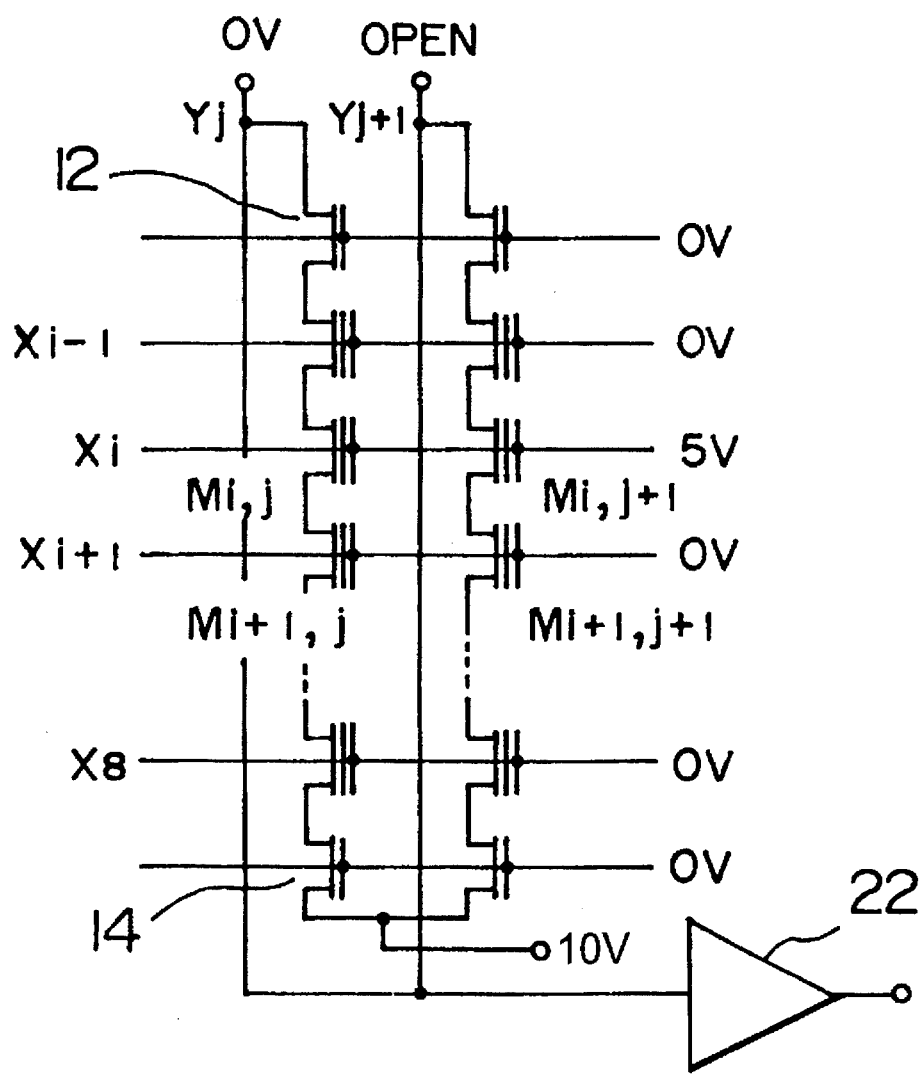
FIG. 6 is an equivalent circuit diagram of the array of the memory cells for explaining a data reading method with respect to the EEPROM according to the embodiment of the semiconductor memory device of the present invention.

A reading operation for data written into the selective memory cell $M_{i,j}$ in the EEPROM of the semiconductor memory device according to the embodiment of the present invention, is carried out in a similar manner to that of the conventional EEPROM only except that definitions about a threshold voltage under the writing state and a threshold voltage under the erasing state are different from these of the conventional EEPROM as explained with reference to FIG. 3. As a consequence, when the selective memory cell $M_{i,j}$ is selected, as illustrated in FIG. 6, the potentials at the gate electrodes of the first selecting transistors 12 and the second selecting transistors 14, and also at the word lines 16 other than the selective word line Xi are set to 0 V, whereas the potential at the selective word line Xi is set to 5 V. In other words, the first selecting transistors 12 and the second selecting transistors 14 are brought into the conducting conditions, and also only the P-channel transistor for forming the selective memory cell Mi,j among the P-channel transistors for constituting the eight series-connected memory cells containing the selective memory cell Mi,j is brought into the non-conducting condition. Also, the potential at the selective bit line Yj is set to 0 V, and the bit lines 13 (non-selective bit line Yi+1 etc.) other than the selective bit line Yj are brought into the open conditions. Consequently, the data corresponding to the threshold voltage of the selective memory cell Mi,j is outputted to the selective bit line Yj and then is supplied to the sense amplifier 22.

Figure 7A:
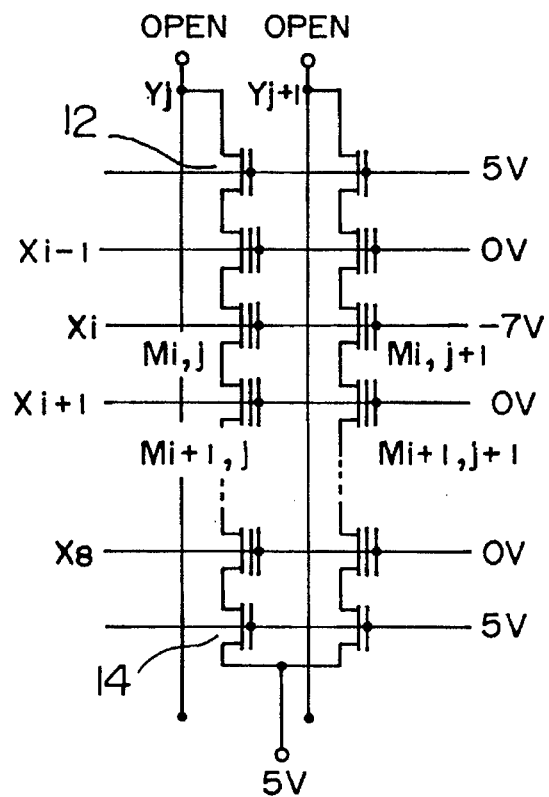
FIG. 7A is an equivalent circuit of the array of the memory cells for explaining a data erasing method with respect to the EEPROM according to the embodiment of the semiconductor memory device of the present invention.
Figure 7B:
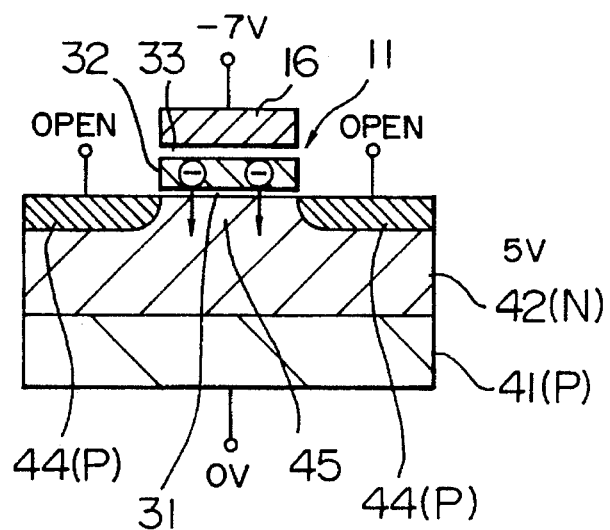
FIG. 7B is a sectional view of the memory cell for explaining the data erasing method with regard to the EEPROM according to the embodiment of the semiconductor memory device of the present invention.

When the data written into the selective memory cell Mi,j is erased, the potential at the N type well 42 is set to 5 V (refer to FIG. 7B), and the potentials at the word lines 16 other than the selective word line Xi are set to 0 V (refer to FIG. 7A). Also, the potentials at the gete electrodes of the first selecting transistors 12 and the second selecting transistors 14 are set to 5 V and further all of the bit lines 13 are brought into the open conditions. Accordingly, since the P-channel transistors for forming the non-selective memory cells other than the selective memory cell Mi,j are brought into the conductive conditions, and both the first selecting transistors 12 and the second selecting transistors 14 are brought into the non-conductive conditions, all of the diffusion layers 44 of the P-channel transistors for constituting the memory cells 11 are brought into the open conditions. Under this condition, an electric field of approximately 12 MV/cm is applied to the gate insulating film 31 between the floating gate electrode 32 of the P-channel transistor for constructing the selective memory cell Mi,j and the N-type well 42 by setting the potential at the selective word line Xi to −7 V. As a result, the electrons present in this floating gate electrode 32 are ejected as the Fowler-Nordheim current into the N-type well 42, so that the threshold voltage of the P-channel transistor for forming the selective memory cell Mi,j is shifted from the negative value to the positive value. At this time, since the potential at this floating gate electrode 32 is increased and the electric field applied to the gate insulating film 31 is weakened while the electrons present in the floating gate electrode 32 are ejected, the Fowler-Nordheim current is self-converged, namely does not flow. As a consequence, the positive threshold voltage after erasing the data depends only upon the film thickness of the gate insulating film 31 and the impurity concentration of the N-type well 42, but does not depend on the amount of the electrons injected into the floating gate electrode 32, so that fluctuation of the positive threshold voltage after erasing the data becomes small.

As the memory cells are constituted by the P-channel transistors in the semiconductor memory device according to the present invention, the threshold voltages can be set to lower values than those of the conventional semiconductor memory device, and the memory cells can be driven under low voltages.

In accordance with the semiconductor memory device of the present invention, fluctuation in the positive threshold voltages of the memory cells under the data non-writing state can be made small, and, on the other hand, there is no limitation such that the threshold voltages of the memory cells are set to the negative values by writing data. As a consequence, the currents flowing when the P-channel transistors for constructing the memory cells are under the conductive conditions may be increased, so that the accessing speed for the selected memory cell can be increased. In case that a semiconductor memory device is mounted on a semiconductor chip identical to a generic CMOS type semiconductor device, the semiconductor memory deice may be easily manufactured with this CMOS type semiconductor device at the same time, and may be protected from the latch-up phenomenon.

Although the invention has been described in its preferred form with a certain degree of particularity, it is understood that the present disclosure of the preferred form has been changed in the details of construction and arrangement of parts may be resorted to without departing from the spirit and the scope of the invention as hereinafter claimed.

What is claimed is:

1. A method for using a semiconductor memory device having a plurality of memory cells series-connected to each other, each memory cell formed by a P-channel transistor in which a control gate electrode is stacked via an insulating film on a floating gate electrode; a first selecting transistor having a source and a drain, one of the source and the drain being connected to one end of said plural memory cells series-connected to each other; a bit line connected to the other of the source and the drain of said first selecting transistor; a second selecting transistor having a source and a drain, one of the source and the drain being connected to the other end of said plural memory cells series-connected to the other; and a power source line connected to the other of the source and the drain of said second selecting transistor; said method comprising the steps of:

setting, to a positive value, a potential at a control gate electrode of a P-channel transistor forming a memory cell selected from said plurality of memory cells;

producing an avalanche breakdown at a drain junction of said P-channel transistor forming said selected memory cell; and writing data into said selected memory cell by injecting electrons generated by the avalanche breakdown into a floating gate electrode of said P-channel transistor forming said selected memory.

2. A method for using a semiconductor memory device as claimed in claim 1, wherein said first selecting transistor and said second selecting transistor are constructed of P-channel transistors.

3. A method for using a semiconductor memory device as claimed in claim 1, wherein said P-channel transistors are fabricated within N-type wells formed in a P-type semiconductor substrate.

4. A method for using a semiconductor memory device having a plurality of memory cells series-connected to each other, each memory cell formed by a P-channel transistor in which a control gate electrode is stacked via an insulating film on a floating gate electrode; a first selecting transistor having a source and a drain, one of the source and the drain being connected to one end of said plural memory cells series-connected to each other; a bit line connected to the other of the source and the drain of said first selecting transistor; a second selecting transistor having a source and a drain, one of the source and the drain being connected to the other end of said plural memory cells series-connected to each other; and a power source line connected to the other of the source and the drain of said second selecting transistor, said method comprising the steps of:

writing data into a memory cell selected from said plurality of memory cells, said writing comprising the steps of:

setting, to a positive value, a potential at a control gate electrode of a P-channel transistor forming said selected memory cell, producing an avalanche breakdown at a drain junction of said P-channel transistor forming said selected memory cell, and writing data into said selected memory cell by injecting electrons generated by the avalanche breakdown into a floating gate electrode of said P-channel transistor forming said selected memory cell; and reading data from the selected memory cell, said reading comprising the steps of:

producing a voltage difference between said one end of said plural memory cells and said other end of said plural memory cells, bringing all P-channel transistors forming memory cells not selected from said plural memory cells, said first selecting transistor, and said second selecting transistor into conductive conditions, selecting a potential at a control gate electrode of a P-channel transistor forming said selected memory cell to be an intermediate voltage between a threshold voltage under a data writing condition and a threshold voltage under a data non-writing condition, and reading data written into said selected memory cell by determining whether or not a current flows through said bit line.

* * * * *